US007974337B2

(12) United States Patent
Momtaz et al.

(10) Patent No.: US 7,974,337 B2
(45) Date of Patent: *Jul. 5, 2011

(54) HIGH SPEED RECEIVE EQUALIZER ARCHITECTURE

(75) Inventors: Afshin Momtaz, Laguna Hills, CA (US); Mario Caresosa, San Clemente, CA (US); David Kyong-Sik Chung, Irvine, CA (US); Davide Tonietto, Ottawa (CA); Guangming Yin, Foothill Ranch, CA (US); Bruce Currivan, Dove Canyon, CA (US); Thomas Kolze, Phoenix, AZ (US); Ichiro Fujimori, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/606,751

(22) Filed: Oct. 27, 2009

(65) Prior Publication Data

US 2010/0046601 A1    Feb. 25, 2010

Related U.S. Application Data

(63) Continuation of application No. 10/880,959, filed on Jun. 30, 2004, now Pat. No. 7,623,600.

(60) Provisional application No. 60/576,176, filed on Jun. 2, 2004.

(51) Int. Cl.
*H03H 7/30* (2006.01)

(52) U.S. Cl. ........ 375/233; 375/229; 375/232; 375/265; 375/230; 375/343; 375/344; 375/345; 375/373

(58) Field of Classification Search .................. 375/233, 375/345, 344, 327, 395, 316, 348, 346, 350, 375/373, 229, 232, 265, 230, 343
See application file for complete search history.

(56) References Cited

U.S. PATENT DOCUMENTS

| 4,520,489 A | 5/1985 | Hogge, Jr. |
|---|---|---|
| 6,577,690 B1 | 6/2003 | Barman et al. |
| 7,034,606 B2 | 4/2006 | Caresosa et al. |
| 7,042,271 B2 | 5/2006 | Chung et al. |
| 7,054,088 B2 | 5/2006 | Yamazaki et al. |
| 7,167,517 B2 | 1/2007 | Farjad-Rad et al. |
| 7,202,707 B2 | 4/2007 | Momtaz |
| 7,330,508 B2 | 2/2008 | Momtaz |
| 7,436,882 B2 | 10/2008 | Momtaz |
| 7,522,847 B2 | 4/2009 | Momtaz et al. |
| 2002/0061087 A1 | 5/2002 | Williams |
| 2004/0076245 A1 | 4/2004 | Okamoto et al. |
| 2004/0131058 A1 | 7/2004 | Ghiasi |
| 2005/0019042 A1 | 1/2005 | Kaneda et al. |
| 2005/0078780 A1 | 4/2005 | Chou et al. |
| 2005/0135471 A1 | 6/2005 | Tonietto et al. |
| 2005/0254569 A1 | 11/2005 | Momtaz |
| 2005/0271136 A1 | 12/2005 | Chung et al. |
| 2005/0271137 A1 | 12/2005 | Kolze et al. |
| 2005/0271169 A1 | 12/2005 | Momtaz et al. |

*Primary Examiner* — Kabir A Timory

(57) ABSTRACT

Various example embodiments are disclosed. According to an example embodiment, an apparatus may include a continuous time filter, a decision feedback equalizer, a clock and data recovery circuit, and an adaptation circuit. The adaptation circuit may be configured to adapt equalization according to at least one dithering algorithm by adjusting a delay adjust signal based on a mean square error of equalized data signals.

17 Claims, 2 Drawing Sheets

HIGH SPEED RECEIVE EQUALIZER ARCHITECTURE

CROSS-REFERENCE TO RELATED APPLICATIONS

This application is a continuation application of U.S. patent application Ser. No. 10/880,959, filed on Jun. 30, 2004, now issued as U.S. Pat. No. 7,623,600, which claims the benefit of U.S. Provisional Patent Application No. 60/576,176, filed Jun. 2, 2004, the disclosures of both of which are hereby incorporated by reference.

TECHNICAL FIELD

This application relates to data communications and, more specifically, to equalization of high speed received signals.

BACKGROUND

In a typical data communications system, data is sent from a transmitter to a receiver over a communications media such as a wire or fiber optic cable. In general, the data is encoded in a manner that facilitates effective transmission over the media. For example, data may be encoded as a stream of binary data (e.g., symbols) that are transmitted through the media as a serial signal.

In general, serial communication systems only transmit data over the communication media. That is, the transmitters in communications systems may not transmit a separate clock signal with the data. Such a clock signal could be used by a receiver to efficiently recover data from the serial signal the receiver receives from the communication media.

When a clock signal is not transmitted, a receiver for a serial communication system may include a clock and data recovery circuit that generates a clock signal that is synchronized with the incoming data stream. For example, the clock and data recovery circuit may process the incoming data stream to generate a clock signal at a frequency that matches the frequency of the data stream. The clock is then used to sample or recover the individual data bits (e.g., "symbols") from the incoming data stream.

In a typical high speed application, symbols in a data stream are distorted as they pass through the media. For example, bandwidth limitations inherent in the media tend to spread the transmitted pulses. As a specific example, in optical communication systems chromatic dispersion and polarization mode dispersion which result from variation of light propagation speed as a function of wavelength and propagation axes may cause symbol spread.

If the width of the spread pulse exceeds a symbol duration, overlap with neighboring pulses may occur, degrading the performance of the receiver. This phenomenon is called inter-symbol interference ("ISI"). In general, as the data rate or the distance between the transmitter and receiver increases, the bandwidth limitations of the media tend to cause more inter-symbol interference.

To compensate for such problems in received signals, conventional high speed receivers may include filters and/or equalizers that, for example, cancel some of the effects of inter-symbol interference or other distortion. Examples of such components include a decision feedback equalizer ("DFE") and a finite impulse response filter ("FIR").

Moreover, some applications use adaptive filters or equalizers that automatically adjust their characteristics in response to changes in the characteristics of the communications media. Typically, the adaptation process involves generating coefficients that control the characteristics of the filter or equalizer. To this end, a variety of algorithms have been developed for generating these coefficients.

The least mean square ("LMS") algorithm is commonly used for optimizing coefficients for various applications such as a finite impulse response filter and an adaptive equalizer such as a decision feedback equalizer. In general, an LMS algorithm generates adaptive coefficients by modifying the current coefficients based on an algorithm that takes into account current and prior samples of the received data. For example, for a two tap DFE the LMS algorithm may be described by the following equations:

$$g1(n)=g1(n-1)+\mu*e*y1 \quad \text{EQUATION 1}$$

$$g2(n)=g2(n-1)+\mu*e*y2 \quad \text{EQUATION 2}$$

where $g(n-1)$ represents the coefficient immediately preceding coefficient $(n)$, $\mu$ is a scalar that relates to, for example, the gain of a feedback loop and the speed with which the loop converges, e is an error signal, and y1 and y2 are prior samples of the received data.

Conventional receiver architectures may not provide optimum equalization of a received signal in high speed applications. For example, the LMS algorithm is not suitable for applications where prior samples of the received data are not available. However, it may be desirable to adjust components of a high speed receiver that do not retain prior samples of the data.

In addition, high speed receiver components may consume relatively large amounts of power and dissipate relatively large amounts of heat. For example, a typical high speed receiver that performs equalization in the digital domain incorporates a very fast digital to analog converter that has a relatively large resolution. Such a digital to analog converter may consume a large amount of power. Moreover, in very high speed CMOS applications (10 Gbps, for example), the high speed components may be implemented using shunt peaking techniques and on-chip spiral inductors. As a result, these components may occupy a relatively large area on the silicon chip. In addition, the use of these components may result in a design with longer interconnect lines and corresponding larger parasitic capacitance.

These and other characteristics of conventional architectures may have a negative impact on the performance of the receiver. Accordingly, a need exists for an improved receiver architecture, in particular for high speed applications.

SUMMARY

The invention relates to a system and method for equalizing high speed signals. For convenience, an embodiment of a system constructed or a method practiced according to the invention will be referred to herein simply as an "embodiment."

In some embodiments, equalization is provided in a high speed communication receiver that includes an automatic gain control input stage, a decision feedback equalizer, a clock and data recovery circuit and equalization control loops.

In one aspect of the invention the automatic gain control input stage provides a constant amplitude signal to the input of the decision feedback equalizer. In some embodiments the automatic gain control input stage includes a continuous time filter that filters the output of a variable gain amplifier and an automatic gain control circuit that maintains a constant amplitude signal at the output of the continuous time filter. In some embodiments the automatic gain control stage may be followed by an adder that adds a threshold adjust signal to the output of continuous time filter.

In one aspect of the invention the continuous time filter linearly equalizes an incoming data signal and may serve to remove precursor distortion from the incoming signal. As a result, the decision feedback equalizer may be used to more effectively reduce inter-symbol interference in the incoming data signal.

In one aspect of the invention the continuous time filter has an adjustable bandwidth. In some embodiments this bandwidth is adjusted to compensate for errors in the received data signal.

In one aspect of the invention the receiver includes an equalizer adapted to reduce channel related distortion in received data and a clock and data recovery circuit coupled to the equalizer. In this aspect of the invention the clock and data recovery circuit generates an extracted clock signal from the equalized data and an equalizer retimer generates recovered equalized data from the equalized data in response to the extracted clock signal.

In one aspect of the invention, one or more flip-flops and/or latches are used in retiming operations in the decision feedback equalizer and in phase detection operations in the clock recovery circuit. For example, in one embodiment, the output of a slicer in a two tap decision feedback equalizer drives a pair of flip-flops connected in series. The flip-flops comprise a pair of latches. The outputs of the two flip-flops are used to generate feedback signals for the decision feedback equalizer. In addition, the output of the first flip-flop and the output of each of the latches in the second flip-flop are used to generate signals that drive a charge pump in the clock recovery circuit. In this circuit, the output of the second flip-flop provides the recovered data.

In one aspect of the invention the clock and data recovery circuit generates an extracted clock signal having an adjustable phase offset from the equalized data. The phase offset may be adjusted to, for example, compensate for processing delays in the equalizer.

In one aspect of the invention the receiver includes a digital to analog converter for generating an error signal from a received data signal such as a soft decision signal. In some embodiments a delay lock loop generates the clock for the analog to digital converter. A relative delay of the clock generated by the delay lock loop may be adjustable to modify the sampling point of the analog to digital converter.

In one aspect of the invention the receiver includes a dithering algorithm circuit to reduce the mean square error ("MSE") in received data. Here, the circuit controls one or more parameters of the components in the communications receiver. For example, the circuit may control an adjustable bandwidth of the continuous time filter, an adjustable delay of the decision feedback equalizer and an adjustable delay of the delay lock loop. By controlling one or more of these parameters using the dithering algorithm, the circuit may reduce the MSE in the received data.

In one aspect of the invention the dithering algorithm is applied to more than one parameter in a nested manner. For example, the circuit may first adjust a first parameter until the algorithm converges. In some embodiments, the algorithm may be deemed to have converged when a value of the first parameter is found that provides the "best MSE. The circuit may then adjust a second parameter by one step, then repeat the dithering algorithm for the first parameter until the algorithm again converges for the first parameter. The circuit then determines whether the MSE has been reduced. If so, the circuit continues to adjust the second parameter in the same direction. If not, the circuit adjusts the second parameter in the opposite direction. This process is repeated until the algorithm for the second parameter converges.

BRIEF DESCRIPTION OF THE DRAWINGS

These and other features, aspects and advantages of the present invention will be more fully understood when considered with respect to the following detailed description, appended claims and accompanying drawings, wherein:

Figure 1:
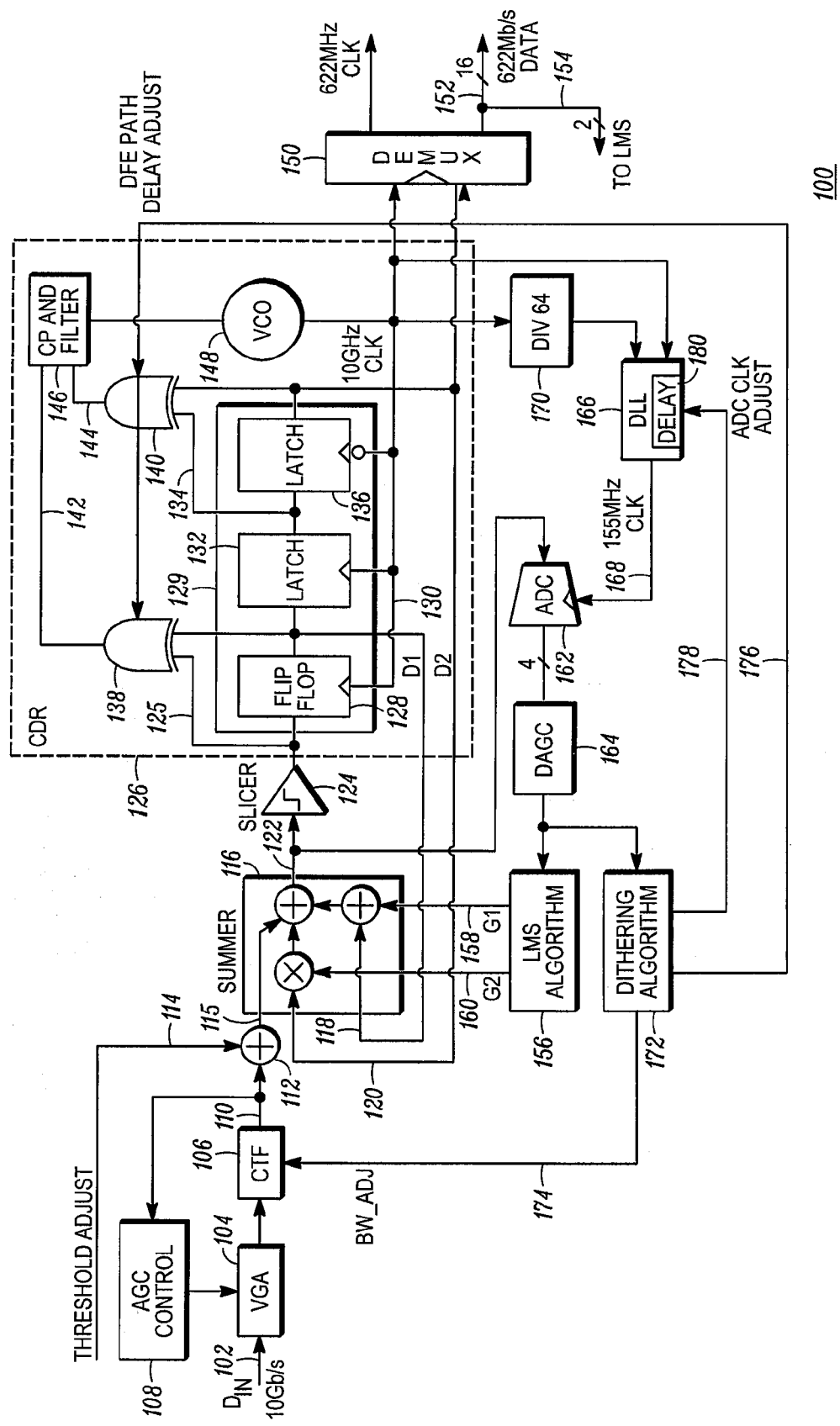
FIG. 1 is a simplified block diagram of one embodiment of a communications receiver constructed in accordance with the invention.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals denote like features throughout the specification and figures.

DETAILED DESCRIPTION

The invention is described below, with reference to detailed illustrative embodiments. It will be apparent that the invention may be embodied in a wide variety of forms, some of which may be quite different from those of the disclosed embodiments. Consequently, the specific structural and functional details disclosed herein are merely representative and do not limit the scope of the invention.

FIG. 1 is a simplified block diagram of one embodiment of a communication receiver 100. The described embodiment relates to a 10 Gbit receiver that employs a continuous time filter and a decision feedback equalizer to reduce errors in a received signal. It should be appreciated, however, that the teachings herein are applicable to other applications, architectures and data rates.

In the embodiment of FIG. 1, incoming data is first amplified by an automatic gain control stage to provide constant amplitude signals at the input of a two tap decision feedback equalizer. The output of the automatic gain control stage may be adjusted by an external threshold adjustment signal. Since the output swing of the automatic gain control stage is independent of the swing of the input data, the external threshold adjustment adjusts the output signal by a fixed percentage.

The automatic gain control stage also includes a continuous time filter that reshapes the received signal pulses to optimize the performance of the decision feedback equalizer. The bandwidth of the continuous time filter is programmable and may be adjusted via an adaptation loop circuit.

The decision feedback equalizer equalizes the data from the automatic gain control stage and provides equalized data signals to a clock and data recovery circuit. The clock and data recovery circuit extracts a clock from the equalized data. The delay of the extracted clock is programmable and may be adjusted using the adaptation loop circuit. In this way, the delay through the feedback path of the decision feedback equalizer may be adjusted.

The decision feedback equalizer uses the extracted clock to retime the equalized data. The decision feedback equalizer may include a retimer 129 that generates recovered equalized data signals from the equalized data signals in response to the extracted clock signal. A demultiplexer stage parallelizes the retimed data to sixteen bits.

The adaptation loop circuit operates at a lower frequency than the received data to reduce power consumption and the area of the adaptation loop circuit. The high speed clock is first divided by 64, then a delay lock loop time aligns the high speed clock with the divided clock. The phase of the delay lock loop is programmable and may be adjusted using the adaptation loop circuit. The output of the delay lock loop drives a low resolution analog to digital converter that samples and quantifies a soft decision signal from the decision feedback equalizer.

The adaptation loop circuit employs two algorithms to update the equalizer coefficients according to the signals generated by the analog to digital converter. An LMS algorithm provides equalization coefficients for the decision feedback equalizer feedback path. A dithering algorithm provides coefficients for a continuous time filter bandwidth adjust, a decision feedback equalizer loop delay adjust and an analog to digital converter timing adjust.

The operation of the components in the receiver 100 will now be described in more detail. Upon receiving an input data signal 102 from, for example, an optical channel, the receiver 100 initially amplifies and filters the signal 102. A variable gain amplifier ("VGA") 104 amplifies the input data signal 102 and provides the amplified data signal to a continuous time filter ("CTF") 106. The continuous time filter 106 filters the data signal using, for example, a low pass filter that has an adjustable bandwidth. In some embodiments the coefficients of the continuous time filter 106 are adjusted to tune the frequency response of the continuous time filter 106 to approximate the inverse of at least a portion of the frequency response of the communication channel.

In the illustrated embodiment the programmable continuous time filter 106 is an adaptive equalizer that filters out noise and compensates for pre-cursor distortions in the incoming signal. The continuous time filter 106 may serve to pre-distort the incoming signal to optimize the performance of the decision feedback equalizer. For example, by reshaping the signal pulses, some of the ISI may be "moved" from the pre-cursor to the post-cursor. The decision feedback equalizer is then used to remove post-cursor ISI.

In some embodiments the programmable continuous time filter 106 comprises one or more cascaded low pass filters (not shown) where the output of a first low pass filter is coupled to the input of the next low pass filter. In some embodiments each of the low pass filters may have approximately the same frequency response. In this case a dithering algorithm circuit 172 may generate, by way of example, a common control signal 174 that adjusts the bandwidth of each of the low pass filters to reduce the level of pre-cursor ISI.

One of skill in the art will appreciate, however, that the low pass filters of the continuous time filter need not have the same frequency response. Rather, the frequency response of each of the individual filters may be unique and optimized for a particular application. In addition, the individual filters need not be driven by a common control signal. Rather the dithering algorithm circuit 172 may individually adjust the bandwidth of the individual filters to compensate for the channel induced distortion.

In some embodiments the low pass filters comprise a buffer stage with a variable capacitive load which is used to adjust the bandwidth of the device. An example of a continuous time filter having an adjustable bandwidth is disclosed in U.S. patent application Ser. No. 10/774,724, filed Feb. 9, 2004, the disclosure of which is hereby incorporated by reference herein. An example of a variable gain amplifier and a continuous time filter is disclosed in commonly owned U.S. patent application Ser. No. 10/841,766, filed May 7, 2004, the disclosure of which is hereby incorporated by reference herein.

A filtered data signal 110 from the continuous time filter 106 is provided to an automatic gain control ("AGC") circuit 108. Under the control of the automatic gain control circuit 108 the variable gain amplifier 104 may appropriately amplify or attenuate small or large amplitude input signals, respectively, to generate an output signal having relatively constant amplitude.

The data signal 110 also is provided to an adder circuit 112. The adder circuit 112 combines a threshold adjust signal 114 with the data signal 110 to adjust the threshold level (e.g., DC offset) of the data signal 110. In this way the threshold level of incoming symbols may be adjusted to enable more effective sampling of the symbols in the decision feedback equalizer.

Since the threshold adjustment is after the automatic gain control stage, the threshold adjustment will not be affected by the swing of the input signal. As a result, threshold adjustment may be accomplished using a fixed value for the threshold adjust signal 114. Accordingly, for receivers that do not incorporate forward error correction and bit error rate techniques to adjust the threshold, the embodiment of FIG. 1 may provide a more effective technique of compensating for characteristics of the channel that affect the threshold of the signal.

A data signal 115 from the adder circuit 112 is provided to a two tap decision feedback equalizer and clock and data recovery circuit. A summer 116 combines the data signal 115 with two equalized feedback signals 118 and 120 to generate a soft decision data signal 122. A slicer 124 converts the soft decision data signal 122 to a binary data signal 125.

The binary data signal 125 drives a pair of flip flops (flip-flop 128 and latch pair 132 and 136). In this embodiment, the flip-flop 128 and latch pair 132 and 136 perform retiming functions for decision feedback equalization and perform phase detection operations for clock and data recovery.

A clock and data recovery ("CDR") circuit 126 incorporates a phase lock loop circuit to extract a 10 GHz clock signal 130 (in this 10 Gbps example) from the binary data signal 125 by, for example, aligning the rising edge of the extracted clock with transitions in the binary data signal 125. In this way, the clock and data recovery circuit 126 may maintain the proper timing relationship between the binary data signal 125 and the clock signal 130 that clocks the binary data signal 125 into the flip-flop 128 and latch pair 132 and 136. Because the clock and data recovery circuit extracts the clock signal from the equalized data provided by the decision feedback equalizer, the circuit may have better locking performance, matching of delays and loading characteristics as compared to conventional clock recovery circuits.

The phase lock loop circuit includes a phase detector (discussed below), a charge pump and filter 146 and a voltage controlled oscillator ("VCO") 148, the operation of each of which may be summarized as follows. The voltage controlled oscillator 148 generates the clock signal 130 that is fed back to the phase detector. The phase detector compares the transition edge of the binary data signal 125 with an edge of the clock 130 and generates corresponding phase error signals 142 and 144 that are sent to the charge pump. The charge pump produces a current that corresponds to the phase error signals and provides this current to the loop filter. The loop filter removes selected undesirable frequency components from the current signal and sends a corresponding voltage signal to the voltage controlled oscillator 148. The voltage controlled oscillator 148 then adjusts the phase of the clock signal 130 according to this voltage signal.

The phase detector includes the flip flop 128, latch pair 132 and 136 and a pair of XOR gates 138 and 140. The binary data signal 125 and the data output signal 118 from the flip-flop 128 are the input signals for the XOR gate 138. The data output signal 134 from the latch 132 and the data output signal 120 from the second latch 136 are the input signals for the XOR gate 140.

By comparing the binary data signal 125 with the clocked outputs of the flip flop 128 and latch pair 132 and 134 the XOR gates 138 and 140 generate phase error signals 142 and 144, respectively, that drive the charge pump and filter 146. In some embodiments, the XOR gate 138 may generate the signal 142 with a pulse width proportional to data/clock phase error. In addition, the XOR gate 140 may generate a signal that is used as a reference for phase error evaluation. An example of a phase detector is disclosed in U.S. patent application Ser. No. 10/776,074, filed Feb. 11, 2004, the disclosure of which is hereby incorporated by reference herein.

The phase lock loop may be controlled to adjust the phase of the clock 130. That is, a signal 176 may be used to create an offset in the detected phase relationship between the clock signal 130 generated by the voltage control oscillator 148 and the binary data signal 125. For example, if the phases of the binary data signal 125 and the clock signal 130 of the voltage control oscillator 148 were perfectly aligned and the value of the signal 176 called for a five degree phase offset, the phase detector would output phase error signals 142 and 144 corresponding to a five degree phase difference between the two signals.

In some embodiments this phase shift may be used to adjust the delay in the decision feedback equalizer loop. For example, the delay through the decision feedback equalizer feedback loops may be adjusted via a signal 176 to provide the feedback signals 118 and 120 to the summer 116 at a desired point in time relative to the data signal 115.

In some embodiments the signal 176 may be used to adjust the phase error signals 142 and 144 output by the phase detector. For example, by changing the duty cycle of these signals, a corresponding change in phase may be achieved. Examples of decision feedback equalizers with adjustable delay are disclosed in U.S. patent application Ser. No. 10/774, 725, filed Feb. 9, 2004, the disclosure of which is hereby incorporated by reference herein.

As mentioned above, the flip flop 128 and latch pair 132 and 136 comprise the flip flops for the decision feedback equalizer that recover data from the binary data signal 125. Here, the clock signal 130 is used to clock the binary signal 125 into the flip-flop 128. In addition, the clock signal 130 clocks the output signal 118 from the flip-flop 128 into a second flip-flop consisting of the latch pair 132 and 136. In this two tap decision feedback equalizer implementation, the output of the second flip-flop provides a recovered data signal 120 that consists of equalized data that has been recovered from the incoming data signal 102.

A demultiplexer ("DEMUX") 150 demultiplexes the recovered data signal 120 to generate parallel data signals that are clocked at a slower rate. For example, in FIG. 1 the demultiplexer 150 generates sixteen parallel data signals 152 at a rate of 622 Mbits per second ("Mbps").

The data outputs signals from the two flip-flops also provide the DFE tap signals for the DFE feedback loop. Specifically, the output signals 118 and 120 are multiplied by equalization coefficients g1 158 and g2 160 (typically negative numbers) and the resulting scaled equalized feedback signals are added by the summer 116 with the data signal 115 as discussed above. Thus, the summer 116 typically subtracts a scaled version of the previous symbols from a current (that is, current, in time) symbol to reduce or eliminate channel induced distortion such as inter-symbol interference. An example of a summer circuit that scales the feedback signals and combines the scaled signals with the input signal without the use of multipliers is described in commonly owned U.S. patent application Ser. No. 10/847,829, filed May 18, 2004, the disclosure of which is hereby incorporated by reference herein.

In general, the values of the equalization coefficients depend on the level of inter-symbol interference that is present in the incoming data. Typically the absolute value of an equalization coefficient (usually a negative number) increases with increasing inter-symbol interference. In some embodiments a least mean square ("LMS") algorithm circuit 156 calculates an error associated with the equalized signals (e.g., the soft decision signal 122) and adjusts the values of the equalization coefficients in accordance with the error.

An example of an LMS circuit is described in commonly owned U.S. patent application Ser. No. 10/846,316, filed May 14, 2004, the disclosure of which is hereby incorporated by reference herein. In this circuit the loading on the high speed data path is reduced by using two of the demultiplexed data signals 154 to provide data for the LMS algorithm. In this case, data must be provided to the LMS algorithm at the appropriate time. To this end, a delay lock loop ("DLL") 166 may be configured to align the edges of a 155 MHz clock 168 with a phase level of a clock that is associated with the data rate of the demultiplexed data signals 154.

As mentioned above, an error signal may be generated from the soft decision signal 122. An analog to digital converter ("ADC") 162 samples the soft decision signal 122 to generate digital signals (four in this case). Because equalization is provided in the analog domain in the embodiment of FIG. 1, the analog to digital converter 162 may run at slower speeds and have a lower resolution as compared to conventional receivers that perform equalization in the digital domain. As a result the embodiment of FIG. 1 may provide significant savings in power consumption compared to such conventional receivers.

The digital signals from the analog to digital converter are provided to a digital automatic gain control circuit ("DAGC") 164. The digital automatic gain control circuit 164 may, for example, adjust the average value of the signal swing to +1 to −1. In other words, the average value of the amplitude error (from "1") is adjusted to zero. The digital output of the digital automatic gain control circuit 164 is provided to the LMS algorithm circuit 156 and the dithering algorithm circuit 172.

In the embodiment of FIG. 1, the components 156, 164 and 172 are implemented in the digital domain. Accordingly, these components may be implemented, for example, as a state machine, a processor with associated software or other known structures.

The analog to digital converter 162 samples the soft decision signal 122 using a 155 MHz clock signal 168 generated by the delay lock loop 166. The relative phase of the clock signal 168 determines the point in time in a given symbol at which the analog to digital converter 162 samples the symbol. The optimum point in time to sample a symbol may depend on the characteristics of the channel.

The delay lock loop 166 includes a delay circuit 180 that may be used to control the phase delay of the clock signal 168. By adjusting this delay, the point at which the analog to digital converter 162 samples symbols from the soft decision signal 122 may be varied so that it samples at approximately the same point in time as the slicer/retimer.

In the embodiment of FIG. 1, the dithering algorithm circuit 172 generates several signals to control the operations of various components in the receiver 100. For example the bandwidth adjust signal 174 controls the bandwidth of the continuous time filter 106. The delay adjust signal 176 adjusts the delay of the clock 130 generated by the clock and data recovery circuit 126. In addition, a clock adjust signal 178 controls the timing of the clock 168 generated by the delay lock loop 166.

In some embodiments, the dithering algorithm circuit 172 modifies the signals 174, 176 and 178 according to an error (e.g., a mean square error or sum square error) associated with a received data signal. For example, mean square error may be calculated from the soft decision signal 122.

The dithering algorithm circuit 172 may reduce the MSE in the receiver 100 by measuring the MSE, then adjusting one or more of the signals 174, 176 and 178, then re-measuring the MSE to compare the new MSE with the prior MSE. If the MSE decreased, the circuit 172 continues to adjust the signals in the same direction (e.g., up or down) as before. If the MSE increased, the circuit 172 adjusts the signals in the opposite direction.

In some embodiments, the dithering algorithm controls the signals 174, 176 and 178 in a nested manner. For example, the circuit 172 may adjust a first signal (e.g., signal 174) until the algorithm converges. In some embodiments, the algorithm may be deemed to have converged when a value of the first signal (e.g., a coefficient value) is found that provides the "best" MSE. The circuit 172 may then adjust a second signal (e.g., signal 176) by one step, then repeat the dithering algorithm for the first signal until the algorithm again converges when adjusting the first signal. The circuit 172 then determines whether the MSE has been reduced. If so, the circuit 172 continues to adjust the second signal in the same direction. If not, the circuit 172 adjusts the second signal in the opposite direction. This process is repeated until the algorithm for the second signal converges.

Examples of dithering algorithms are disclosed in commonly owned U.S. patent application Ser. No. 10/879,673, filed Jun. 29, 2004, entitled SYSTEM AND METHOD FOR ADJUSTING MULTIPLE CONTROL LOOPS USING COMMON CRITERIA, the disclosure of which is hereby incorporated by reference herein.

Figure 2:
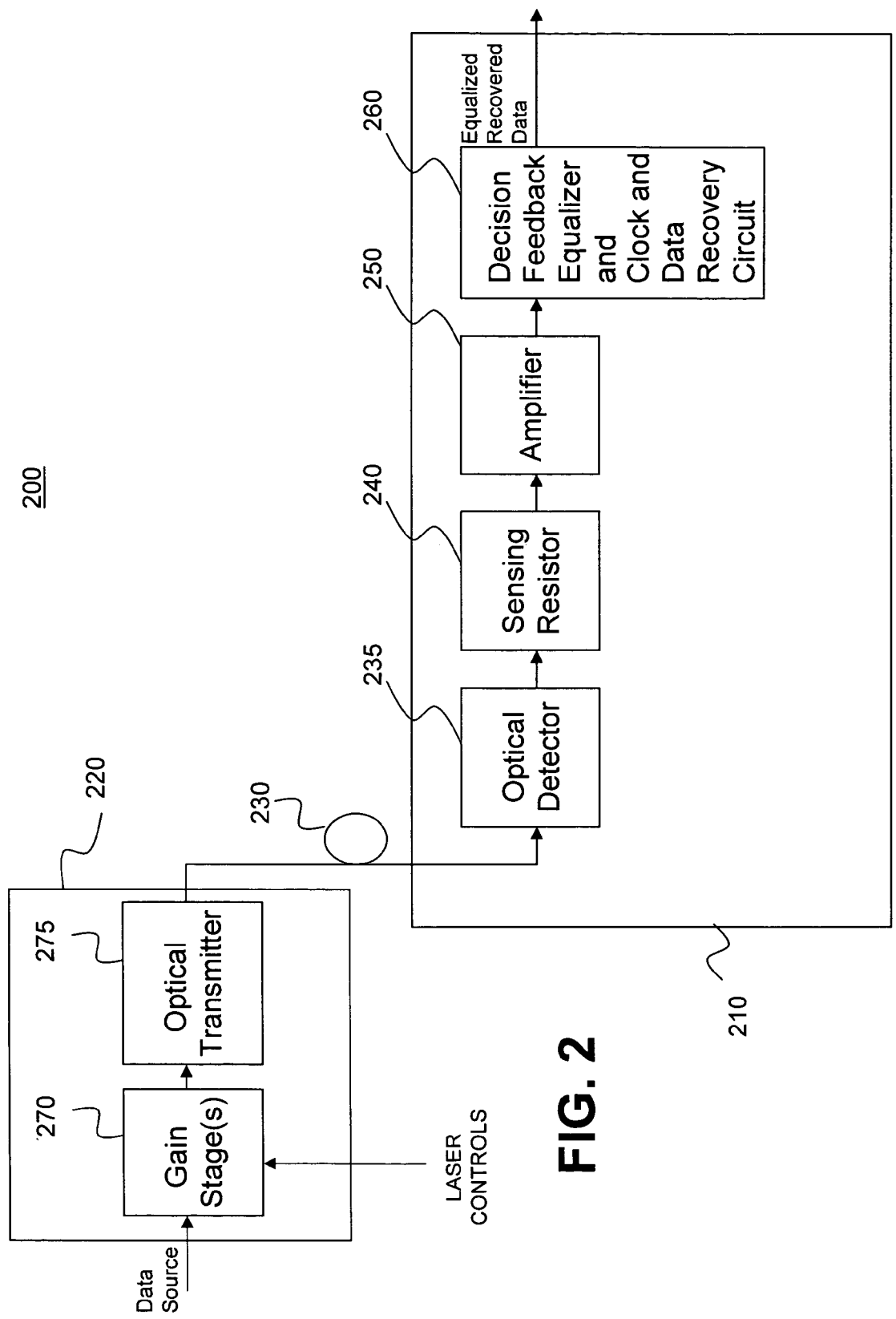
FIG. 2 is a simplified block diagram of one embodiment of an optical communication system constructed in accordance with the invention.

The systems and methods described herein may be integrated into any of a variety of applications. For example, referring to FIG. 2, the described exemplary receiver circuit may be incorporated into an optical receiver assembly 210 of an optical communication system 200. The optical system 200 includes an optical transmitter 220 and an optical fiber network 230 that carries the optical signal to the optical receiver assembly 210. Those skilled in the art will appreciate that the teachings of the invention are not limited to a single optical transmitter and receiver or to optical receivers. For example, practical optical communications systems may have one or more optical transmitters as well as one or more optical receivers.

The illustrated receive path includes an optical detector 235, sensing resistor 240, one or more amplifier(s) 250, and an integrated decision feedback equalizer and clock and data recovery circuit 260. The optical detector 235 may comprise a known prior art optical detector implementation. Such prior art detectors convert incoming optical signals into corresponding electrical output signals that may be electronically monitored.

A transmit path includes, by way of example, one or more gain stage(s) 270 coupled to an optical transmitter 275. The gain stage(s) 270 may have multiple stages, and may receive one or more control signals for controlling various different parameters of the output of the optical transmitter. In one embodiment an analog data source provides an analog data signal that modulates the output of the optical transmitter. In other embodiments, baseband digital modulation or frequency modulation may be used.

In this embodiment, the gain stage(s) 270 amplify the incoming data signal from the data source according to laser control signals. The amplified data signal, in turn, drives the optical transmitter 275.

The optical transmitter may, for example, be a light emitting diode or a surface emitting laser or an edge emitting laser that operate at high speeds such as 10 Gigabits per second ("Gbps") or higher. The optical transmitter 275 thereby generates an optical data signal that provided to a fiber optic cable 230.

The fiber optic cable 230 carries the optical data signal to the optical detector 235. In operation, when the transmit optical beam is incident on a light receiving surface area of the optical detector, electron-hole pairs are generated. A bias voltage applied across the optical detector 235 generates a flow of electric current having intensity proportional to the intensity of the incident light. In one embodiment, this current flows through sensing resistor 240, and generates a voltage.

The sensed voltage is amplified by the one or more amplifier(s) 250 and the output of amplifier(s) 250 drives the integrated decision feedback equalizer and clock and data recovery circuit 260. The decision feedback equalizer may include, by way of example, a slicer that generates a binary signal that drives a clock and data recovery circuit. The clock and data recovery circuit generates an extracted clock signal from the binary signal that is then used to retime the equalized data as discussed above. Examples of integrated decision feedback equalizer and clock and data recovery circuits are described in U.S. patent application Ser. No. 10/774,965, filed Feb. 9, 2004, now issued as U.S. Pat. No. 7,436,882, and U.S. patent application Ser. No. 10/823,252, filed Apr. 10, 2004, the disclosures of which are hereby incorporated by reference herein.

A receiver constructed according to the invention may support various data protocols and data rates. For example, in one embodiment the receiver is a multi-rate SONET/SDH/10GE/FEC receiver that may operate at very high speeds including, for example, 9.953, 10.3125, 10.664 or 10.709 Gbps. This receiver includes, in a single chip solution, an optical equalizer and CDR as discussed above, a linear amplifier, deserializer and other components.

In one embodiment the receiver chip is implemented using CMOS technology. However, the teachings herein are applicable to other types of processes including for example, GaAs, Bi-MOS, Bipolar, etc. Moreover, different types of transistors such as NFETS and PFETS may be used to implement circuits according to the teachings herein.

Some embodiments may incorporate a variable resistor circuit to, for example, compensate for process variations in resistors in an integrated circuit. In this way, important timing relationships that depend on resistance values may be maintained in the circuit. Such a process-compensated resistor load structure essentially reduces the resistor process variation, which may significantly ease the design optimization requirements of various components in the circuit. Details of a process-compensated resistor load circuit may be found in commonly owned U.S. patent application Ser. No. 10/840,524, filed May 6, 2004, the disclosure of which is hereby incorporated by reference herein.

Different embodiments of the invention may include a variety of hardware and software processing components. In some embodiments of the invention, hardware components such as controllers, state machines and/or logic are used in a system constructed in accordance with the invention. In some embodiments of the invention, code such as software or firmware executing on one or more processing devices may be used to implement one or more of the described operations.

Such components may be implemented on one or more integrated circuits. For example, in some embodiments several of these components may be combined within a single integrated circuit. In some embodiments some of the components may be implemented as a single integrated circuit. In some embodiments some components may be implemented as several integrated circuits.

The components and functions described herein may be connected/coupled in many different ways. The manner in which this is done may depend, in part, on whether the components are separated from the other components. In some embodiments some of the connections represented by the lead lines in the drawings may be in an integrated circuit, on a circuit board and/or over a backplane to other circuit boards.

The signals discussed herein may take several forms. For example, in some embodiments a signal may be an electrical signal transmitted over a wire while other signals may consist of light pulses transmitted over an optical fiber. A signal may comprise more than one signal. For example, a differential signal comprises two complementary signals or some other combination of signals. In addition, a group of signals may be collectively referred to herein as a signal.

Signals as discussed herein also may take the form of data. For example, in some embodiments an application program may send a signal to another application program. Such a signal may be stored in a data memory.

The components and functions described herein may be connected/coupled directly or indirectly. Thus, in some embodiments there may or may not be intervening devices (e.g., buffers) between connected/coupled components.

In summary, the invention described herein generally relates to an improved high speed receive equalization architecture. While certain exemplary embodiments have been described above in detail and shown in the accompanying drawings, it is to be understood that such embodiments are merely illustrative of and not restrictive of the broad invention. In particular, it should be recognized that the teachings of the invention apply to a wide variety of systems and processes. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. An apparatus comprising:
a continuous time filter configured to filter a signal to provide a filtered signal to a summer;
the summer configured to combine the filtered signal with feedback signals received from a decision feedback equalizer to generate a soft decision signal and provide the soft decision signal to the decision feedback equalizer and an adaptation circuit;
the decision feedback equalizer configured to receive the soft decision signal from the summer and to provide equalized data signals to a clock and data recovery circuit based on the soft decision signal and to provide the feedback signals to the summer;
the clock and data recovery circuit configured to generate an extracted clock signal from at least a portion of the equalized data signals based on a delay adjust signal received from an adaptation circuit; and
the adaptation circuit configured to provide the delay adjust signal to the clock and data recovery circuit and adjust the delay adjust signal based on a mean square error of the soft decision signal received from the summer.

2. The apparatus of claim 1, wherein the adaptation circuit is configured to adapt the equalization according to at least one dithering algorithm by adjusting the delay adjust signal based on a change of the mean square error of the soft decision signal.

3. The apparatus of claim 1, wherein the adaptation circuit is configured to adapt the equalization according to at least one dithering algorithm by adjusting the delay adjust signal in a same direction as a previous adjustment if a mean square error of the soft decision signal decreases and adjusting the delay adjust signal in an opposite direction from the previous adjustment if the mean square error of the soft decision signal increases.

4. The apparatus of claim 1, wherein the decision feedback equalizer comprises a retimer configured to generate recovered equalized data signals from the equalized data signals in response to the extracted clock signal.

5. The apparatus of claim 1, further comprising a variable gain amplifier configured to receive an input data and a control signal, the variable gain amplifier being configured to amplify the input data signal based on the control signal to provide the signal to the continuous time filter.

6. The apparatus of claim 1, further comprising:
a variable gain amplifier configured to receive an input data signal from outside the apparatus and a control signal from an automatic gain control circuit, the variable gain amplifier being configured to amplify the input data signal based on the control signal to provide the signal to the continuous time filter; and
the automatic gain control circuit configured to receive the filtered signal from the continuous time filter and to provide the control signal to the variable gain amplifier based on the control signal.

7. The apparatus of claim 1, further comprising a demultiplexer configured to receive the equalized data signals from the decision feedback equalizer and demultiplex the recovered equalized data into a plurality of signals each having a data rate lower than the signal filtered by the continuous time filter.

8. The apparatus of claim 1, wherein:
the continuous time filter is configured to filter the signal based on a bandwidth adjust signal received from the adaptation circuit; and
the adaptation circuit is configured to provide the bandwidth adjust signal to the continuous time filter and to modify the bandwidth adjust signal based on the mean square error of the soft decision signal.

9. An apparatus comprising:
a continuous time filter coupled to an adaptation circuit, the continuous time filter being configured to filter a signal based on a bandwidth adjust signal received from the adaptation circuit to provide a filtered signal to a summer;
the summer configured to combine the filtered signal with feedback signals received from a decision feedback signal received from a decision feedback equalizer to generate a soft decision signal and provide the soft decision signal to the decision feedback equalizer and an adaptation circuit;

the decision feedback equalizer configured to receive the filtered soft decision signal from the summer and to provide equalized data signals to a clock and data recovery circuit based on the soft decision signal and to provide the feedback signals to the summer, the decision feedback equalizer including a retimer configured to generate recovered equalized data signals from the equalized data signals in response to receiving an extracted clock signal from the clock and data recovery circuit;

the clock and data recovery circuit configured to generate the extracted clock signal from at least a portion of the equalized data signals based on a delay adjust signal received from the adaptation circuit and provide the extracted clock signal to the decision feedback equalizer; and the adaptation circuit configured to provide the bandwidth adjust signal to the continuous time filter and the delay adjust signal to the clock and data recovery circuit and to adjust at least one of the bandwidth adjust signal and the delay adjust signal based on a mean square error of the soft decision signal received from the summer.

10. The apparatus of claim 9, wherein the adaptation circuit is configured to adjust at least one of the bandwidth adjust signal and the delay adjust signal based on the mean square error of the soft decision signal according to at least one dithering algorithm.

11. The apparatus of claim 9, wherein the adaptation circuit is configured to adjust at least one of the bandwidth adjust signal and the delay adjust signal based on the mean square error of the soft decision signal according to at least one dithering algorithm by adjusting at least one of the bandwidth adjust signal and the delay adjust signal in a same direction as a previous adjustment if the mean square error of the soft decision signal decreases and adjusting the at least one of the bandwidth adjust signal and the delay adjust signal in an opposite direction from the previous adjustment if the mean square error of the soft decision signal increases.

12. The apparatus of claim 9, further comprising an analog to digital converter configured to provide a digital signal to the decision feedback equalizer based on the soft decision signal provided to the analog to digital converter by the summer.

13. The apparatus of claim 9, further comprising a variable gain amplifier configured to receive an input signal from outside the apparatus and a control signal from an automatic gain control circuit, the variable gain amplifier being configured to amplify the input signal based on the control signal to provide the signal to the continuous time filter.

14. The apparatus of claim 9, further comprising:

a variable gain amplifier configured to receive an input signal from outside the apparatus and a control signal from an automatic gain control circuit, the variable gain amplifier being configured to amplify the input signal based on the control signal to provide the signal to the continuous time filter; and the automatic gain control circuit configured to receive the filtered signal from the continuous time filter and to provide the control signal to the variable gain amplifier based on the filtered signal.

15. The apparatus of claim 9, further comprising a delay lock loop configured to generate a clock signal from the extracted clock signal.

16. An apparatus comprising:

a decision feedback equalizer configured to receive a signal and to generate equalized data signals based on the signal;

a clock and data recovery circuit coupled to the decision feedback equalizer, wherein the clock and data recovery circuit is configured to generate an extracted clock signal from at least a portion of the equalized data signals based on a delay adjust signal; and an adaptation circuit coupled to the continuous time filter, the decision feedback equalizer, and the clock and data recovery circuit, the adaptation circuit being configured to adapt equalization according to at least one dithering algorithm by adjusting the delay adjust signal based on a mean square error of the equalized data signals, wherein the adaptation circuit is configured to adapt the equalization according to the at least one dithering algorithm by adjusting the delay adjust signal in a same direction as a previous adjustment to the equalization if a mean square error of the equalized data signals decreases and adjusting the delay adjust signal in an opposite direction from the previous adjustment to the equalization if the mean square error of the equalized data signals increases.

17. The apparatus of claim 16, further comprising a continuous time filter configured to provide a filtered signal to the decision feedback equalizer.

* * * * *